(12) United States Patent
Middelman et al.

(10) Patent No.: US 6,472,593 B1
(45) Date of Patent: Oct. 29, 2002

(54) HYBRID ROOF COVERING ELEMENT

(75) Inventors: Erik Middelman, Arnhem; Eleonoor Andel Van, Enschede, both of (NL)

(73) Assignee: Akzo Nobel N.V., Arnhem (NL)

( * ) Notice: Subject to any disclaimer, the term of this patent is extended or adjusted under 35 U.S.C. 154(b) by 0 days.

(21) Appl. No.: 09/831,484

(22) PCT Filed: Sep. 8, 2000

(86) PCT No.: PCT/EP00/08943

§ 371 (c)(1),
(2), (4) Date: Sep. 10, 2001

(87) PCT Pub. No.: WO01/18881

PCT Pub. Date: Mar. 15, 2001

(30) Foreign Application Priority Data

Sep. 9, 1999 (NL) .............................................. 1013011
Dec. 2, 1999 (NL) .............................................. 1013730

(51) Int. Cl.[7] .................... H01L 31/058; H01L 31/048; E04D 13/18
(52) U.S. Cl. ........................ 136/248; 136/246; 136/259; 136/291; 126/622; 126/623; 126/621; 126/625; 126/626; 126/634; 126/643; 52/173.3
(58) Field of Search .................................. 136/246, 248, 136/259, 291; 126/622, 623, 621, 625, 626, 634, 643; 52/173.3

(56) References Cited

U.S. PATENT DOCUMENTS 4,361,717 A * 11/1982 Gilmore et al. ............. 136/246
4,607,132 A * 8/1986 Jarnagin ..................... 136/248
5,589,006 A * 12/1996 Itoyama et al. ............. 136/248

FOREIGN PATENT DOCUMENTS

| EP | 335 261 A2 | 10/1989 |
| EP | 788 171 A2 | 8/1997 |
| EP | 789 404 A1 | 8/1997 |
| EP | 820 105 A2 | 1/1998 |
| WO | WO 98/13882 A1 | 4/1998 |
| WO | WO 99/49483 A1 | 9/1999 |

OTHER PUBLICATIONS

Abstract of JP 11 103087 (1999)—Patent Abstracts of Japan vol. 1999, No. 9.
International Search Report PCT/EP 00/08943, Jan. 23, 2001.

* cited by examiner

*Primary Examiner*—Alan Diamond
(74) *Attorney, Agent, or Firm*—Richard P. Fennelly

(57) ABSTRACT

A hybrid roof covering element, which suitable for simultaneously heating a medium and generating electricity, and which comprises a single or multiple transparent layer, a flexible thin film solar cell sheet with a heat capacity of less than 3.5 kJ/m$^2$K and a thermally insulating material, and a medium to be heated. The flexible thin film solar cell sheet comprises a carrier, a back electrode, a photovoltaic layer, and a transparent conductive front electrode and has a heat capacity of less than 3.5 kJ/m$^2$K. This hybrid roof covering element has a response speed of more than $5.7 \cdot 10^{-4}$ K/J if the medium to be heated is air and a response speed of more than $1 \cdot 10^{-4}$ K/J if the medium to be heated is water.

14 Claims, No Drawings

HYBRID ROOF COVERING ELEMENT

The invention pertains to a hybrid roof covering element comprising a thin film solar cell sheet. Hybrid roof covering elements are elements which can suitably be mounted on or in roof structures or otherwise integrated into buildings or, if so desired, in stand-alone systems, in which solar energy is employed in two ways. On the one hand, solar energy is converted into electricity by a thin film solar cell sheet. On the other hand, solar energy is used to heat a gaseous and/or liquid medium, such as air and/or water.

Hybrid roof covering elements comprising a thin film solar cell sheet are known. They are described, e.g., in U.S. Pat. No. 5,589,006 and EP 0 820 105. U.S. Pat. No. 5,849,006 describes a hybrid roof covering element comprising, from top to bottom, a top layer composed of, preferably, a transparent coating, a thin film solar cell sheet cast in a filler, a back insulating member, a filler layer, and a roofing sheet. Air is passed underneath the roofing sheet. EP 0 820 105 describes a system where a thin film solar cell sheet is provided on a back plate of high load bearing capacity and high processability, so that the plate can be freely bent into any desired shape, more specifically into a trapezoidal shape. The air is passed underneath the back plate and over the thin film solar cell sheet.

Although these hybrid roof covering elements function adequately, they are open to improvement, especially as regards heat generation efficiency.

It has now been found that an improvement can easily be effected in this field by directly contacting a thin film solar cell sheet with low heat capacity with the medium to be heated. This will result in higher efficiency on the part of the roof covering element, as less energy is required to heat the thin film solar cell sheet itself, leaving more energy for useful processing. This leads to a higher response speed on the part of the hybrid roof covering element.

The invention thus pertains to a hybrid roof covering element comprising a thin film solar cell sheet that is characterized in that it has a heat capacity of less than 3.5 $kJ/m^2 \cdot K$, preferably less than 600 $J/m^2 \cdot K$.

The thin film solar cell sheet used in the hybrid roof covering element according to the invention is a flexible thin film solar cell sheet. The flexibility of the film is attractive for a number of reasons. First of all, said flexibility makes it possible to transport the thin film solar cell sheet in rolled-up form to the place where the roof covering elements are assembled. Secondly, it is easier to divide flexible thin film solar cells up into sections of the desired size than rigid thin film solar cells on, say, a glass carrier. Thirdly, the flexibility of the thin film solar cell sheet makes it possible for the film to be integrated into the roof covering element in different ways if so desired, as a result of which the position of the film vis-à-vis the sun can be optimized and any desired aesthetic effects may be obtained. Thus a flexible thin film solar cell sheet can not only be made into a flat sheet as is most common, but also bent into, say, a trapezoidal or some other desired shape. Thin film solar cell sheets manufactured by means of a roll-to-roll process are particularly attractive, as they very fully satisfy the desired properties of easy transportation and easy dividing up into sections of the desired size.

The thin film solar cell sheet used in the hybrid roof covering element according to the invention generally is composed of a flexible carrier, a back electrode, a photovoltaic layer, and a transparent front electrode. If so desired, the thin film solar cell sheet may be provided with one or more protective layers or other top layers. The heat capacity of such a thin film solar cell sheet is determined principally by the nature of the carrier and any protective and top layers present. In selecting these materials care has to be taken to ensure that the desired properties as regards heat capacity are obtained.

The thin film solar cell sheet employed in the hybrid roof covering element according to the invention preferably has an overall thickness of less than 1000 $\mu$m, more preferably of less than 500 $\mu$m, most preferably of less than 300 $\mu$m. Generally speaking, the thinner the thin film solar cell sheet, the lower its heat capacity will be.

The thin film solar cell sheet employed in the hybrid roof covering element according to the invention preferably has a weight per surface area of less than 1400 $g/m^2$, more preferably of less than 700 $g/m^2$. Generally speaking, the lighter the thin film solar cell sheet, the lower its heat capacity will be. Furthermore, lighter sheets may result in simpler and less costly transportation and processing.

Suitable materials for the carrier layer of the thin film solar cell sheet include thermoplastic or thermosetting polymer films, combinations thereof, and, optionally, fibre-reinforced variations thereon. Suitable thermosetting materials include polyimides, unsaturated polyesters, vinyl esters, SI, etc. The thermoplastic materials may be amorphous as well as semi-crystalline. Examples of suitable amorphous thermoplastics are PEI, PSU, PC, PPO, PES, PMMA, SI, PVC, PVDC, FEP, and various other fluorine-containing polymers. Examples of suitable semi-crystalline materials are PET, PEN, PEEK, PEKK, PP, and PTFE. Examples of suitable liquid-crystalline materials are PPTA (Twaron, Aramica, Kevlar (all trade marks)). Use may be made of melt-extruded films as well as solution-, emulsion- or suspension-cast films. Biaxially drawn films as a rule will have superior mechanical properties. Metal films on which an insulating (dielectric) top layer has been provided, or compositions of polymer and fiber reinforcement like glass fiber reinforced epoxy-may also serve as a carrier layer if so desired.

Polymeric "co-extruded" films provided with a thermoplastic adhesive layer with a softening point below that of the carrier itself are preferred. Optionally, the coextruded film is provided with an anti-diffusion layer of, e.g., aluminium or SiOx.

At present, preference is given to biaxially drawn polyesters, preferably ones provided with an inorganic anti-diffusion coating.

The thickness of the carrier preferably is 75 $\mu$m to 1 mm. Preferred ranges are 100 $\mu$m to 600 $\mu$m and 150 $\mu$m to 300 $\mu$m. As indicated above, the use of a thin film solar cell sheet manufactured by means of a roll-to-roll process is attractive. An attractive roll-to-roll process for the manufacture of a flexible thin film solar cell sheet comprises the following steps:

a. providing a temporary substrate
b. applying the transparent conductive electrode onto said substrate
c. applying the photovoltaic layer
d. applying the back electrode
e. applying a permanent carrier onto the back electrode
f. removing the temporary substrate.
g. optionally applying a transparent protective layer The reason why this process is so attractive for manufacturing thin film solar cell sheets for use in hybrid roof covering elements is that the use of the temporary substrate makes it possible for the front electrode of the transparent conductive oxide, the photovoltaic layer, and the back electrode to be applied under such conditions as will produce a solar cell of good quality. The permanent carrier which is applied onto the thin film solar cell sheet at a later stage can be selected such that it will readily satisfy the conditions imposed by specific use in a hybrid roof covering element. However, there is no need for the permanent substrate to be resistant to the conditions, e.g., the high temperature conditions, prevailing during the application of the front electrode, the photovoltaic layer, and the back electrode, as a result of which there is greater freedom of choice when it comes to selecting the permanent carrier.

For that reason the invention also pertains to hybrid roof covering element comprising a thin film solar cell sheet manufactured by a process comprising the aforesaid steps a–g. Examples of suitable processes are those described in WO 98/13882 and WO 99/49483.

The nature of the back electrode, the PV layer, and the transparent front electrode are not crucial to the present invention.

The transparent front electrode as a rule will be a transparent conductive oxide (TCO). Examples of suitable transparent conductive oxides are indium tin oxide, zinc oxide, zinc oxide doped with aluminium, fluor, or boron, cadmium sulphide, cadmium oxide, tin oxide, and, most preferably, F-doped $SnO_2$. Said last-mentioned transparent electrode material is preferred, because it can form a desired crystalline surface with a columnar crystal structure when applied at a temperature above 400° C., preferably in the range of 500 to 600° C. In addition, it is more resistant to chemicals than the much-used indium tin oxide. Also, it is far less costly.

In the present description the term "PV layer" or "photovoltaic layer" encompasses the entire system of layers needed to absorb light and generate electricity. Suitable layer configurations are known, as are methods to apply them. For general prior art in this field reference may be made to Yukinoro Kuwano, "Photovoltaic Cells," Ullmann's *Encyclopedia*, Vol.A20 (1992), 161, and "Solar Technology," Ullmann's *Encyclopedia*, Vol.A24 (1993), 369.

Various thin-film semi-conductors can be utilized in the manufacture of the PV layer. Examples are amorphous silicon (a-Si:H), microcrystalline silicon, polycrystalline amorphous silicon carbide (a-SiC), amorphous silicon germanium (a-SiGe), and a-SiGe:H. In addition, the PV layer in the thin film solar cell sheet according to the invention may comprise, e.g., CIS (copper indium diselenide, $CuInSe_2$) PV cells, cadmium telluride cells, Cu(In,Ga)Se cells, ZnSe/CIS cells, ZnO/CIS cells, Mo/CIS/CdS/ZnO cells, and dye-sensitised cells. Stacked cells may also be applied.

Preferably, the PV layer is an amorphous silicon layer when the TCO comprises a fluorine-doped tin oxide. In that case the PV layer as a rule will comprise a set, or a plurality of sets of p-doped, intrinsic, and n-doped amorphous silicon layers, with the p-doped layers being arranged on the side receiving the incident light.

The back electrode in the thin film solar cell sheet according to the invention preferably serves both as reflector and as electrode. The back electrode may comprise any suitable material having light reflecting properties, preferably aluminium, silver, or a combination of layers of both. In the case of silver, it is preferred to first apply an adhesion promoter layer. $TiO_2$ and ZnO are examples of suitable materials for an adhesion promoter layer and have the advantage of also possessing reflecting properties when applied in a suitable thickness, e.g., of about 80 nm.

The hybrid roof covering element according to the invention has a higher response speed than conventional hybrid roof covering elements where the thin film solar cell sheet has been cast in a filler or is present on a rigid weatherproof carrier with load bearing capacity, e.g., made of copper plate. Response speed in this context means the rate at which the temperature of the matter to be heated changes when the radiation intensity changes. The response speed thus is defined as the change in temperature per unit of time per change in net flux and has the unit K/J.

In the case of the hybrid roof covering element according to the invention, it is possible to distinguish the response speed of the thin film solar cell sheet itself on the one hand and the response speed of the medium to which the heat is dissipated on the other. This latter value is also referred to as the response speed of the hybrid roof covering element. The response speed of the thin film solar cell sheet itself is a first indication of the response speed of the hybrid roof covering element. The thin film solar cell sheets employed in the hybrid roof covering element according to the invention preferably have a response speed of more than $5.7 \cdot 10^{-4}$ K/J, more preferably of more than $11 \cdot 10^{-4}$ K/J. When the medium in the hybrid roof covering element to be heated is air, the response speed of the roof covering element preferably is more than $5.7 \cdot 10^{-4}$ K/J, more preferably more than $11 \cdot 10^{-4}$ K/J. When the medium in the hybrid roof covering element to be heated is water, the response speed of the roof covering element preferably is more than $1 \cdot 10^{-4}$ K/J, more preferably more than $2 \cdot 10^{-4}$ K/J.

The hybrid roof covering element according to the invention can be constructed in different forms. It may be suitable for the simultaneous generation of electricity and hot water; alternatively, it may be suitable for the simultaneous generation of electricity and hot air. Depending on the individual circumstances, other gaseous or liquid media may also be heated.

The hybrid roof covering element according to the invention may comprise, for example, from top to bottom, a single or multiple transparent layer, a thin film solar cell sheet, and a thermally insulating material. Between the transparent layer and the thin film solar cell sheet and/or between the thin film solar cell sheet and the thermally insulating material there is a space comprising the medium to be heated, such as air. In this case the single or multiple transparent layer preferably has a transparency to visible light of more than 70% and a k-value of less than 4 $W/m^2.K$. The k-value is a parameter conventionally used in the art for the isolation performance of panels.

The hybrid roof covering element according to the invention is described in greater detail below with reference to a roof covering element suitable for heating air, but it will be evident to the skilled person that the heating of different media can be carried out in a corresponding manner.

In a hybrid roof covering element according to the invention which is suitable for the simultaneous generation of electricity and hot air, the thin film solar cell sheet is present in a space into which cold air is introduced on one side while hot air is discharged on the other. The air's supply and discharge may result from natural draught or be brought about by a ventilating plant.

In the roof covering element the thin film solar cell sheet may be mounted such that it is suspended freely, so that air will pass over the thin film solar cell sheet on either side. If so desired, the thin film solar cell sheet may be mounted on a rigid substrate with good insulating properties in the hybrid roof covering element. In said latter case, the heat capacity of the substrate should be so low that the combined heat capacity of the thin film solar cell sheet and the rigid substrate does not exceed 3000 $J/m^2K$. Preferably, the combined heat capacity of the thin film solar cell sheet and the rigid substrate is less than 900 J/m²K, more preferably less than 450 J/m²K.

As regards energy efficiency, it is preferred to mount the thin film solar cell sheet in an air chamber, so that the thin film solar cell sheet will be in contact with the air flowing past on either side. For reasons of firmness the use of a rigid substrate may be desired. The rigid substrate is made of, e.g., (foamed) plastic or a similar material and constructed in the thinnest possible form.

The air chamber has to be insulated sufficiently also on the side receiving the incident sunlight, this in order to ensure that the heat generated is not dissipated to the outside air. This can be achieved by providing a suitable insulating top layer. As described above, this top layer preferably has a transparency to visible light of more than 70% and a k-value of less than 4 W/m²·K. As was observed earlier, there is no need for the thin film solar cell sheet to be mounted flatly. It can also be mounted shaped in a certain way, e.g., as disclosed in EP 0 820 105, or in any other manner.

The most efficient way of obtaining hot water using a hybrid roof covering element according to the invention is to generate hot air in the hybrid roof covering element and use this to generate hot water with the aid of a heat exchanger.

EXAMPLE 1

A hybrid roof covering element for the simultaneous generation of electricity and hot air is built up of the following elements, from top to bottom: a sealing against the effects of the weather, a transparent insulating cavity plate of plastic underneath which air can flow, a thin film solar cell sheet on a foam plastic insulating layer, and a roofing layer. The roof covering element is provided with inlets and outlets for cold and hot air, respectively. The air is heated in the space between the thin film solar cell sheet and the transparent insulating plastic plate.

The thin film solar cell sheet comprises a plastic carrier with superimposed thereon an aluminium back electrode which also acts as reflector, a photovoltaic layer of amorphous silicon, and a layer of fluorine-doped tin oxide as transparent front electrode. The film is covered with a protective top layer of polymer. The thin film solar cell sheet has a heat capacity of 440 J/m²K, a thickness of 250 $\mu$m, and a weight per surface area of 300 g/m². The thin film solar cell sheet and foam plastic plate combined have a heat capacity of 2500 J/m²K.

The thin film solar cell sheet has a response speed of $2.2 \cdot 10^{-4}$ K/J. The roof covering element has a response speed of $6.7 \cdot 10^{-4}$ K/J.

What is claimed is:

1. A hybrid roof covering element, suitable for simultaneously heating a medium and generating electricity, which comprises a single or multiple transparent layer, a flexible thin film solar cell sheet with a heat capacity of less than 3.5 kJ/m²K and a thermally insulating material, and a medium to be heated, wherein the flexible thin film solar cell sheet comprises a carrier, a back electrode, a photovoltaic layer, and a transparent conductive front electrode, and wherein the hybrid roof covering element has a response speed of more than $5.7 \cdot 10^{-4}$ K/J if the medium to be heated is air and a response speed of more than $1 \cdot 10^{-4}$ K/J if the medium to be heated is water.

2. A hybrid roof covering element according to claim 1 wherein the flexible thin film solar cell sheet has weight per surface area of less than 1400 grams per m².

3. A hybrid roof covering element according to claim 1 wherein the flexible thin film solar cell sheet has weight per surface area of less than 700 grams per m².

4. A hybrid roof covering element according to claim 1 wherein the flexible thin film solar cell sheet has a thickness of less than 1000 $\mu$m.

5. A hybrid roof covering element according to claim 1 wherein the flexible thin film solar cell sheet has a thickness of less than 500 $\mu$m.

6. A hybrid roof covering element according to claim 1 wherein the flexible thin film solar cell sheet has a thickness of less than 250 $\mu$m.

7. A hybrid roof covering element according to claim 4 wherein the carrier has a thickness of 75 $\mu$m to less than 1 mm.

8. A hybrid roof covering element according to claim 4 wherein the carrier has a thickness of 100 $\mu$m to 600 $\mu$m.

9. A hybrid roof covering element according to claim 4 or 5 wherein the carrier has a thickness of 150 $\mu$m to 300 $\mu$m.

10. A hybrid roof covering element according to claim 1 wherein the flexible thin film solar cell sheet is manufactured by means of a roll-to-roll process.

11. A hybrid roof covering element according to claim 10 wherein the flexible thin film solar cell sheet is manufactured by means of a process comprising the following steps providing a temporary substrate, applying the transparent conductive front electrode onto said substrate, applying the photovoltaic layer, applying the back electrode, applying the carrier onto the back electrode, removing the temporary substrate, and optionally applying a transparent protective layer.

12. A hybrid roof covering element according to claim 1 wherein between the transparent layer and the thin film solar cell sheet and/or between the thin film solar cell sheet and the thermally insulating material there is a space which comprises the medium to be heated.

13. A hybrid roof covering element according to claim 1 wherein the single or multiple transparent layer has a transparency to visible light of more than 70% and a k-value of less than 4 W/m²·K.

14. A hybrid roof covering element according to claim 1 wherein the medium to be heated is air and the energy from the air heated in the hybrid roof covering element is used to heat water with the aid of a heat exchanger.

* * * * *